United States Patent
Zeidler et al.

(10) Patent No.: US 10,163,603 B2
(45) Date of Patent: Dec. 25, 2018

(54) PARTICLE BEAM SYSTEM AND METHOD FOR THE PARTICLE-OPTICAL EXAMINATION OF AN OBJECT

(71) Applicant: Carl Zeiss Microscopy GmbH, Jena (DE)

(72) Inventors: Dirk Zeidler, Oberkochen (DE); Stefan Schubert, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/654,014

(22) Filed: Jul. 19, 2017

(65) Prior Publication Data
US 2017/0316912 A1 Nov. 2, 2017

Related U.S. Application Data

(60) Provisional application No. PCT/EP2016/052291, filed on Feb. 3, 2016.

(30) Foreign Application Priority Data

Feb. 6, 2015 (DE) .......................... 10 2015 202 172

(51) Int. Cl.
*H01J 37/10* (2006.01)
*H01J 37/244* (2006.01)
(Continued)

(52) U.S. Cl.
CPC .............. *H01J 37/10* (2013.01); *H01J 37/05* (2013.01); *H01J 37/244* (2013.01); *H01J 37/28* (2013.01);
(Continued)

(58) Field of Classification Search
CPC .......... H01J 37/05; H01J 37/10; H01J 37/244; H01J 37/28; H01J 37/292;
(Continued)

(56) References Cited

U.S. PATENT DOCUMENTS 6,201,240 B1 3/2001 Dotan et al.
7,205,559 B2 * 4/2007 Hamashima .......... F01N 3/2828
  250/397
(Continued)

FOREIGN PATENT DOCUMENTS

DE  10 2013 014 976  3/2015
DE  10 2013 016 113  3/2015
(Continued)

OTHER PUBLICATIONS

Taiwanese Office Action and Search Report, with translation thereof, for corresponding Appl No. 105102647, dated Apr. 19, 2017.
(Continued)

*Primary Examiner* — David E Smith
(74) *Attorney, Agent, or Firm* — Fish & Richardson P.C.

(57) ABSTRACT

A particle beam system includes a particle source to produce a first beam of charged particles. The particle beam system also includes a multiple beam producer to produce a plurality of partial beams from a first incident beam of charged particles. The partial beams are spaced apart spatially in a direction perpendicular to a propagation direction of the partial beams. The plurality of partial beams includes at least a first partial beam and a second partial beam. The particle beam system further includes an objective to focus incident partial beams in a first plane so that a first region, on which the first partial beam is incident in the first plane, is separated from a second region, on which a second partial beam is incident. The particle beam system also a detector system including a plurality of detection regions and a projective system.

22 Claims, 8 Drawing Sheets

(51) Int. Cl.
*H01J 37/28* (2006.01)
*H01J 37/29* (2006.01)
*H01J 37/05* (2006.01)

(52) U.S. Cl.
CPC ..... *H01J 37/292* (2013.01); *H01J 2237/0453* (2013.01); *H01J 2237/24465* (2013.01); *H01J 2237/24485* (2013.01); *H01J 2237/24507* (2013.01); *H01J 2237/24564* (2013.01); *H01J 2237/24585* (2013.01); *H01J 2237/2806* (2013.01); *H01J 2237/2817* (2013.01); *H01J 2237/2857* (2013.01)

(58) Field of Classification Search
CPC ..... H01J 2237/0453; H01J 2237/24465; H01J 2237/24485; H01J 2237/24507; H01J 2237/24564; H01J 2237/24585; H01J 2237/2806; H01J 2237/2817; H01J 2237/2857
See application file for complete search history.

(56) References Cited

U.S. PATENT DOCUMENTS

| | | | |
|---|---|---|---|
| 8,624,182 | B2 | 1/2014 | Watanabe et al. |
| 8,705,172 | B2 | 4/2014 | Kleppe et al. |
| 2003/0066961 | A1 | 4/2003 | Kienzle et al. |
| 2003/0141451 | A1* | 7/2003 | Sato ............... G01N 23/22 250/310 |
| 2006/0011833 | A1 | 1/2006 | Ren |
| 2007/0228274 | A1* | 10/2007 | Elyasaf ............ G01N 23/2251 250/306 |
| 2009/0114818 | A1* | 5/2009 | Casares ............ H01J 37/045 250/307 |
| 2010/0320382 | A1* | 12/2010 | Almogy ............ H01J 37/05 250/307 |
| 2013/0032729 | A1 | 2/2013 | Knippelmeyer |
| 2013/0270438 | A1 | 10/2013 | Lanio et al. |
| 2013/0270439 | A1 | 10/2013 | Adamec |
| 2015/0014527 | A1 | 1/2015 | Otsuka |
| 2015/0069235 | A1 | 3/2015 | Kemen et al. |
| 2015/0077844 | A1 | 3/2015 | Singer et al. |
| 2015/0083911 | A1 | 3/2015 | Zeidler et al. |

FOREIGN PATENT DOCUMENTS

| | | |
|---|---|---|
| DE | 102010049627 A1 | 3/2015 |
| EP | 2 654 068 A1 | 10/2013 |
| TW | 579536 | 3/2004 |
| TW | 1412053 B | 10/2013 |
| WO | WO 2005/024881 A2 | 3/2005 |
| WO | WO 2007/028595 | 3/2007 |
| WO | WO 2007/028596 | 3/2007 |
| WO | WO 2007/060017 | 5/2007 |
| WO | WO 2011/124352 | 10/2011 |

OTHER PUBLICATIONS

German Office Action, with translation thereof, for corresponding Appl No. 10 2015 202 172.6, dated Oct. 28, 2015.
Translation of International Search Report for corresponding Appl No. PCT/EP2016/052291, dated Jun. 20, 2015. (3 pages).
Yeong-Uk Ko et al., "Simulation of imaging in projection microscope using multibeam probe," Optical Sensing II, vol. 4689, Jul. 1, 2002, pp. 565-575.

* cited by examiner 601   603   200   600   604   602   205   209

PARTICLE BEAM SYSTEM AND METHOD FOR THE PARTICLE-OPTICAL EXAMINATION OF AN OBJECT

CROSS-REFERENCE TO RELATED APPLICATIONS

The present application is a continuation of, and claims benefit under 35 USC 120 to, international application PCT/EP2016/052291, filed Feb. 3, 2016, which claims benefit under 35 USC 119 of German Application No. 10 2015 202 172.6, filed Feb. 6, 2015. The entire disclosure of these applications are incorporated by reference herein.

FIELD

The disclosure relates to a particle beam system which operates with a multiplicity of particle beams.

BACKGROUND

WO 2005/024881 A2 discloses a multiple particle beam system in the form of an electron microscopy system which operates with a multiplicity of electron beams in order to scan an object to be examined in parallel by way of a bundle of electron beams. The bundle of electron beams is produced by virtue of an electron beam produced by an electron source being directed to a multi-aperture plate which has a multiplicity of apertures. Some of the electrons of the electron beam impinge on the multi-aperture plate and are absorbed there, and another part of the beam passes through the apertures of the multi-aperture plate such that an electron beam is formed in the beam path behind each aperture, the cross section of which electron beam is defined by the cross section of the aperture. Furthermore, suitably selected electric fields, which are provided in the beam path upstream and/or downstream of the multi-aperture plate, lead to each aperture in the multi-aperture plate acting as a lens on the electron beam passing through the aperture, and so said electron beam is focused in a plane which lies at a distance from the multi-aperture plate. The plane, in which the foci of the election beams are formed, is imaged by subsequent optics onto the surface of the object to be examined such that the individual electron beams impinge on the object in focus as primary beams. There, they generate backscattered electrons or secondary electrons emanating from the object, which are formed to form secondary beams and are directed onto a detector via further optics. On said detector, each one of the secondary beams impinges on a separate detector element such that the electron intensities detected therewith provide information about the object at the location at which the corresponding primary beam is incident on the object. The bundle of primary beams is systematically scanned over the surface of the object in order to produce an electron-microscopic image of the object in the manner conventional for scanning electron microscopy.

SUMMARY

The disclosure seeks to provide a multiple beam particle beam system and, in particular, to further improve the contrast production in such a multiple beam particle beam system. A further goal lies in specifying developed methods for particle-optical examination of objects.

In accordance with one embodiment, the particle beam system includes a particle source, configured to produce a first beam of charged particles. Furthermore, the particle beam system includes a multiple beam producer, configured to produce a plurality of partial beams from the first incident beam of charged particles, which partial beams are spaced apart spatially in a direction perpendicular to a propagation direction of the partial beams. Here, the plurality of partial beams includes at least a first partial beam and a second partial beam. The particle beam system furthermore includes an objective, configured to focus incident partial beams in a first plane in such a way that a first region, on which the first partial beam is incident in the first plane, is separated from a second region, on which a second partial beam is incident. Furthermore, the particle beam system includes a detector system including a plurality of detection regions and a projective system. The projective system is configured to project interaction products, which leave the first plane due to the incident partial beams, onto the detection regions of the detector system. Here, the projective system and the plurality of detection regions are matched to one another in such a way that interaction products emanating from the first region of the first plane are projected onto a first detection region of the detector system and interaction products emanating from the second region of the first plane are projected onto a second detection region. Here, the second detection region differs from the first detection region. Furthermore, the detector system includes a filter device for filtering the interaction products in accordance with their respective trajectory.

By way of suitable filtering of interaction products in accordance with the respective trajectory thereof, it is possible to increase the contrast in an image which is created by merging the output signals of the detector system for the various detection regions to form an overall image. Here, the filtering should not be restricted to masking or suppressing interaction products whose trajectories extend in an outer region far away from the optical axis of the projective system.

The charged particles can be electrons or ions. In particular, the interaction products can be secondary electrons or backscattered electrons. However, the interaction products can also be primary particles which experience a movement reversal due to a deceleration potential between the objective and the object, without a physical scattering process occurring between the primary particles and the object.

In one embodiment, the filter device has a plurality of first detection fields, which are associated with the first detection region. Furthermore, the filter device has a plurality of second detection fields, which are associated with the second detection region. Here, each first and second detection field is embodied to detect the interaction products incident on the respective detection field in a manner independent of interaction products incident on other detection fields. Expressed differently, this detector has a multiplicity of detection fields for each detection region, which detection fields detect interaction products independently from one another in each case. Such instruments are known from light microscopy, from the documents U.S. Pat. No. 8,705,172B2 and DE102010049627 A1, and the yet to be published German patent application No. 10 2013 218 795.5.

The particle beam system can furthermore include a controller embodied to separately readout and process detector signals from the plurality of detection fields of an associated detection region. Important additional information can be obtained by evaluating the associated detector signals generated from the various detection fields. By way of example, an analysis of the detector signals for each detection field renders it possible to establish whether the associated primary partial beam is incident on an object surface in focus, i.e. whether the surface of the object coincides with the first plane at the location of the incident partial beam. This information can subsequently be used to actuate an automated adjustment system, such as an autofocus system, a detector adjustment system or a filter adjustment system, in order to achieve ideal focusing of the partial beams on a surface of the object. Furthermore, additional information about the topography of an examined object can be obtained at the location at which the associated partial beam is incident on the object by comparing the detector signals of the detection fields belonging to the same detection region. Furthermore, averaging the detector signals belonging to the plurality of detection regions or to a whole image allows information to be obtained about the inclination of the sample within the region defined by the averaged detection regions on the surface of the object (object region). Moreover, the global geometry of the object within the region on the surface of the object, which is defined by the evaluated detector signals, can be determined by evaluating the detector signals belonging to the plurality of detection regions and this information can be used for correcting a focus and/or correcting an astigmatism in the object regions adjacent to the evaluated object region.

In a further embodiment, the detection system can additionally include an element producing a dispersion. The element producing the dispersion then leads to the interaction products associated with a detection region being split in accordance with their respective kinetic energy. By comparing the detector signals belonging to the detection fields of the same detection region, it is possible to deduce the kinetic energy of the interaction products when they emerge from the object. A voltage contrast can be produced thus. Here, a voltage contrast should also be understood to mean that, for secondary electrons which emerge from the object from object regions with different electric charge, the potential with which said secondary electrons emerge from the object differs. One example for this are contact holes in semiconductor structures, which establish contacts between different planes of the conductor track structures. If there is no connection between two planes in such a contact hole, the irradiation with charged particles, e.g. electrons, leads to charging in the contact hole as the charge cannot dissipate. The inelastically scattered particles (e.g. electrons) or secondary electrons then start from a different electric potential than in the case of a contacted contact hole. As a result of the fact that it is possible to distinguish these electrons from one another due to their different kinetic energies, which lead to different trajectories due to the element producing a dispersion, it is possible to detect non-contacted contact holes with a significantly higher speed as the signal-to-noise ratio is greatly increased.

As an alternative to an embodiment with an element producing a dispersion, the filter device can also be a dispersion-producing imaging energy filter. The detected interaction products can be split and selected in accordance with their kinetic energies with the aid of such an energy filter. This embodiment can also be used to produce a voltage contrast.

In accordance with a further embodiment, the projective system includes a crossover plane and the filter device is embodied as a stop arranged in the vicinity of this crossover plane. In particular, the stop can have a ring-shaped aperture. What can be achieved with the aid of the ring-shaped stop is that only those interaction products emerging from the examined object are detected which emerge from the object under a specific virtual start angle range. As a result of the ring-shaped stop, there is a selection according to that vector component of the initial velocity of the interaction products emerging from the object that is directed parallel to the object surface. As a result of this, it is possible to obtain additional information about the topography of the object surface or the material at the object surface at the location on which the associated partial beam is incident. In particular, it is possible to partially filter via the ring-shaped stop the energy distribution of the interaction products passing through the stop. Since the energy distribution of the interaction products, particularly in the case of secondary electrons as interaction products, depends inter alia also on the local surface potential and the number of emitted secondary electrons, the atomic mass number of the atoms at the location at which the secondary electrons emerge from the object, additional information can thus be obtained about the material composition of the object at the respective location on the object surface, to the extent that assumptions can be made about the sample surface.

In accordance with a further embodiment, the projective system can include a plurality of particle beam lenses arranged in series behind one another, which produce at least two crossover planes following one another in succession. Then respectively one stop can be arranged in each one of the at least two crossover planes. By way of example, a first stop can have a central aperture, through which only interaction products, the trajectories of which extend sufficiently close to the optical axis of the projective system, can pass. Using such a "bright field stop", it is possible to prevent crosstalk between the various detection regions. Expressed differently, what can be prevented with the aid of the "bright field stop" is that interaction products which emerge from a first region of the first plane impinge on a detection region that is associated with a different region in the first plane. Once again, a stop with a ring-shaped aperture can be arranged in the second crossover plane. Like in the embodiment already described above, it is then possible to obtain additional information about the atomic mass number at the object surface and/or generate additional topography contrast. This can preferably be carried out with a dark field stop.

By varying the focal distances of the particle beam lenses, it is possible to vary the filter effect obtained by the stops. Hence the focal distances of the particle beam lenses can be variable in a further embodiment.

The particle beam lenses can be embodied as magnetic lenses or as electrostatic lenses, or they can be embodied as combination lenses with superposed magnetic and electrostatic fields.

In accordance with a further embodiment, the particle beam system furthermore includes a beam deflection system that is embodied to deflect the first particle beam and the second particle beam perpendicular to the propagation direction thereof. In this case, the controller is furthermore embodied to merge detector signals, belonging to different deflections of the partial beams, of the various detection regions to form an image. By deflecting the partial beams, a whole first region can be scanned by each partial beam and the image information produced by scanning by way of the plurality of partial beams can be merged to form an overall image.

In accordance with a further embodiment, the disclosure relates to a method for particle-microscopic examination of an object, including the following steps:

simultaneously irradiating the object in a plurality of mutually separated field regions with respectively one primary beam of charged particles, collecting interaction products emerging from the object due to the incident primary beams, projecting the interaction products onto a plurality of detection regions of a detector in such a way that the interaction products emerging from two different field regions are projected onto different detection regions of the detector, and filtering the interaction products in a manner dependent on their respective trajectory.

In particular, the interaction products can be filtered in accordance with their kinetic energy.

As already described further above, the filtering of the interaction products can be implemented in one embodiment with the aid of a detector which includes a plurality of mutually independent detection fields sensitive to interaction products for each detection region. Here, the signals of the detection fields belonging to the same detection region can be evaluated relative to one another in order, for example, to produce an image with an improved voltage contrast, an improved topography contrast or an improved material contrast. Furthermore, it is possible to highlight edges with a specific alignment or create a height profile of the object surface.

The particle beam system is operated in the so-called reflection mode in a further embodiment for a method for particle-microscopic examination of an object. In this method, an electrostatic potential is applied to the object to be examined, which potential substantially corresponds to the electric potential of the particle beam producer or the particle beam producers (particle source). As a result of the electrostatic potential applied to the object, the primary particle beams are decelerated as in the case of an electrostatic mirror to a kinetic energy of zero prior to reaching the object, but in the direct vicinity of the object surface, and accelerated back in the reverse direction, i.e. in the direction back to the objective. Those particles that experienced a movement reversal due to the electrostatic potential of the object are collected and the collected charged particles are subsequently projected onto a plurality of detection regions of a detector in such a way that the charged particles collected from two different field regions in the object plane are projected onto different detection regions of the detector. There is filtering of the collected particles as a function of their respective trajectory in this embodiment of a method according to the disclosure as well. Here, the collected particles can be filtered with the aid of a detector which has a plurality of mutually independent detection fields sensitive to the collected particles for each detection region.

When operating the particle beam system in the reflection mode for examining electrically nonconductive objects, it is possible to virtually completely avoid local electric charging of the object by the incident primary beams in the case of suitably selected radiation parameters since the primary particles of the partial beams do not penetrate into the object. If the object potential is varied, it is possible to determine the object potential at which the primary particles land on the object surface with vanishing kinetic energy. As a result of this, it is possible to determine the electric potential of the object charge. If this is carried out for a multiplicity of different points on the object surface, it is possible to determine the electric potential profile in the vicinity of the object surface. As a result of the above-described filtering of the interaction products, it is moreover possible to determine the trajectories of said interaction products. The trajectories allow the form of the local potential profile in the vicinity of the surface of the object to be deduced, and from this it is possible to deduce the local topography of the object surface. As a result of the "contactless" sensing of the surface, it is possible to largely dispense with methods for charge compensation. In particular, it is possible to determine the sample topography with a higher accuracy from a plurality of data records by varying parameters such as object potential or focal position of the multiple beam particle beam system. Accordingly, the method can also contain the steps of varying the object potential, determining the potential profile in the vicinity of the object surface and determining the local topography of the object surface from the local potential profile in the vicinity of the surface of the object.

In a further embodiment of a method for particle-microscopic examination of an object using a multiple beam particle beam system, the interaction products, which emerge from the object due to the incident primary beams, are initially collected with a first suction field and projected onto a plurality of detection regions of a detector in such a way that the interaction products emerging from two different field regions are incident on different detection regions of the detector. Subsequently, the interaction products which emerge from the object due to the incident primary beams are collected with the aid of a second suction field, which differs from the first suction field. The interaction products collected by the second suction field are subsequently also in turn projected onto a plurality of detection regions of a detector in such a way that the secondary particles emerging from the object from two different field regions are projected onto different detection regions of the detector. Subsequently, the detector signals belonging to different suction fields but the same detection region are combined with one another by calculation in such a way that a data signal enriched by topography effects of the object is produced, which is then subsequently used for image production and image depiction. This method can be performed analogously for three, four or more different suction fields in order to achieve a higher accuracy when combining by calculation. If the suction field is able to penetrate into the object, this method can also be used to image structures below the object surface, which are not visible in the individual images.

In the above-described method, in which interaction products are detected in different suction fields, it is also possible, prior to the detection of the interaction products, to additionally carry out filtering of the interaction products in a manner dependent on their respective trajectory. As described above, the filtering can be implemented by Fourier filtering in a crossover plane with a stop with a circular or ring-shaped aperture that is transmissive for interaction products. As an alternative thereto and as was likewise already described further above, the filtering of the interaction products can be implemented with the aid of a detector which has a plurality of mutually independent detection fields sensitive to interaction products for each detection region.

BRIEF DESCRIPTION OF THE DRAWINGS

Below, details of the aforementioned and further embodiments are explained on the basis of the figures.

DESCRIPTION OF EXEMPLARY EMBODIMENTS

Figure 1:
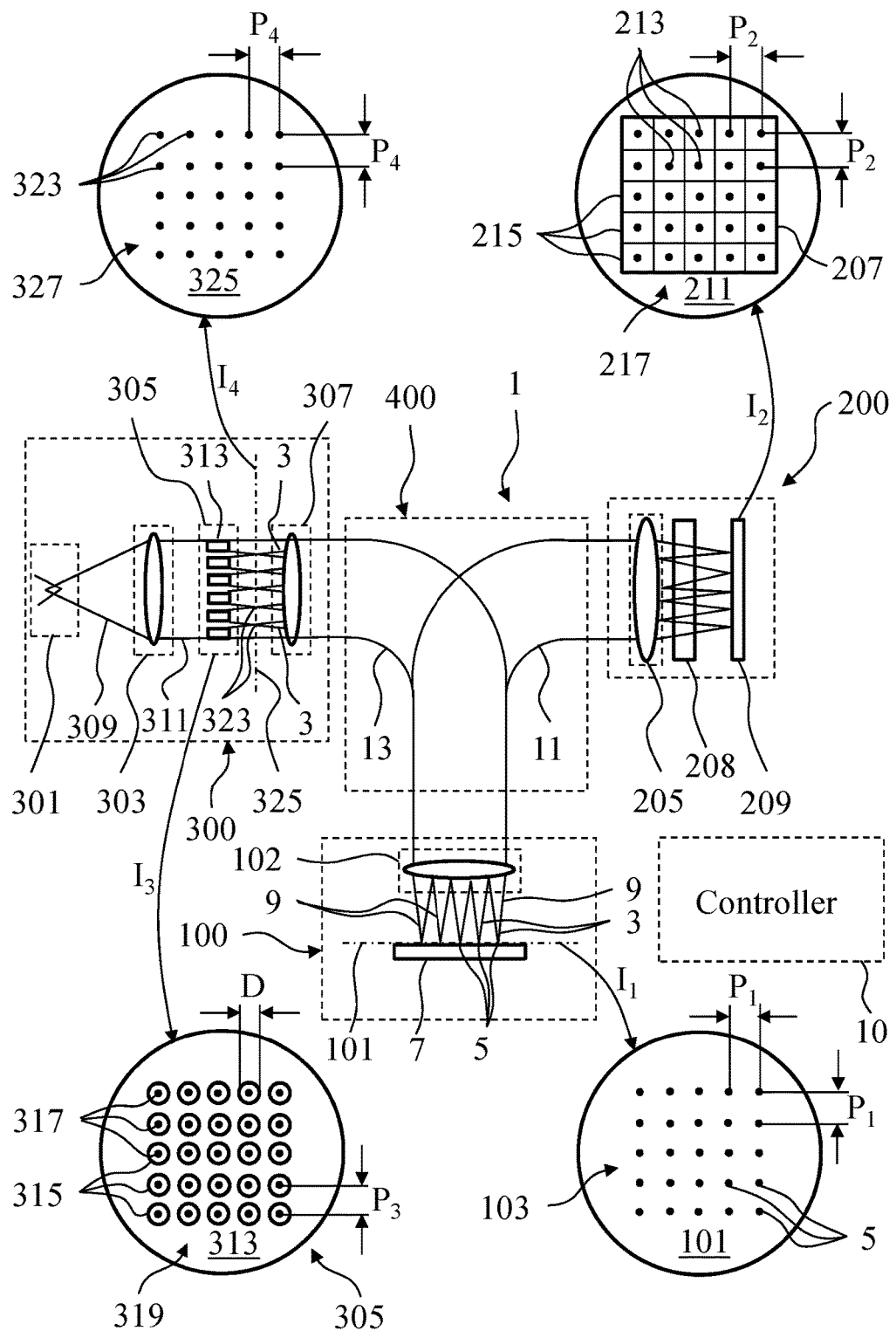
FIG. 1 shows a schematic diagram of an embodiment of a multiple beam particle beam instrument.

FIG. 1 is a schematic illustration of a particle beam system 1 which uses a multiplicity of particle beams. The particle beam system 1 produces a multiplicity of particle beams which are incident on an object to be examined in order to generate interaction products, e.g. secondary electrons, there, which interaction products emanate from the object and are subsequently detected. The particle beam system 1 is of the scanning electron microscope (SEM) type, which uses a plurality of primary partial beams 3 which impinge at a plurality of locations 5 on a surface of the object 7 and which produce a plurality of spatially separated electron beam spots there. The object 7 to be examined can be of any type and, for example, include a semiconductor wafer, a biological sample and an arrangement of miniaturized elements or the like. The surface of the object 7 is arranged in a first plane 101 (object plane) of an objective lens 102 of an objective lens system 100.

The magnified section I1 in FIG. 1 shows a top view of the object plane 101 with a regular rectangular field 103 of impingement locations 5 formed in the first plane 101. In FIG. 1, the number of impingement locations is 25, which form a 5×5 field 103. The number 25 of impingement locations is a small number selected in order to simplify the illustration. In practice, the number of beams or impingement locations can be selected to be substantially greater, such as e.g. 20×30, 100×100 and the like.

In the illustrated embodiment, the field 103 of impingement locations 5 is a substantially regular rectangular field with a constant distance $P_1$ between adjacent impingement locations. Exemplary values for the distance $P_1$ are 1 micrometer, 10 micrometers and 40 micrometers. However, it is also possible for the field 103 to have different symmetries, such as e.g. a hexagonal symmetry.

A diameter of the beam spots formed in the first plane 101 may be small. Exemplary values for this diameter are 1 nanometer, 5 nanometers, 10 nanometers, 100 nanometers and 200 nanometers. Focusing of the particle beams 3 to form the beam spots 5 is implemented by the objective lens system 100.

The primary particles impinging on the object produce interaction products, for example secondary electrons, backscattered electrons or primary particles which have experienced a movement reversal for other reasons, which emanate from the surface of the object 7 or from the first plane 101. The interaction products emanating from the surface of the object 7 are formed by the objective lens 102 into secondary particle beams 9. The particle beam system 1 provides a particle beam path 11 in order to feed the multiplicity of secondary particle beams 9 to a detector system 200. The detector system 200 includes particle optics with a projection lens 205 to direct the secondary particle beams 9 onto a particle multi-detector 209.

The section 12 in FIG. 1 shows a top view of a plane 211, in which individual detection regions of the particle multi-detector 209, on which the secondary particle beams 9 impinge at locations 213, lie. The impingement locations 213 lie in a field 217 with a regular distance $P_2$ from one another. Exemplary values of the distance $P_2$ are 10 micrometers, 100 micrometers and 200 micrometers.

The primary particle beams 3 are produced in a beam production apparatus 300, which includes at least one particle source 301 (e.g. an electron source), at least one collimation lens 303, a multi-aperture arrangement 305 and a field lens 307. The particle source 301 produces a divergent particle beam 309, which is collimated, or largely collimated, by the collimation lens 303 in order to form a beam 311 which illuminates the multi-aperture arrangement 305.

The section 13 in FIG. 1 shows a top view of the multi-aperture arrangement 305. The multi-aperture arrangement 305 includes a multi-aperture plate 313, which has a plurality of openings or apertures 315 formed therein. Center points 317 of the apertures 315 are arranged in a field 319, which corresponds to the field 103 that is formed by the beam spots 5 in the object plane 101. A spacing P3 of the center points 317 of the apertures 315 from one another can have exemplary values of 5 micrometers, 100 micrometers and 200 micrometers. The diameters D of the apertures 315 are smaller than the spacing P3 of the center points of the apertures. Exemplary values of the diameters D are 0.2×P3, 0.4×P3 and 0.8×P3.

Particles of the illuminating particle beam 311 pass through the apertures 315 and form partial beams 3. Particles of the illuminating beam 311 which impinge on the plate 313 are captured by the latter and do not contribute to forming the partial beams 3.

The multi-aperture arrangement 305 focuses each one of the partial beams 3 due to an applied electrostatic field in such a way that beam foci 323 are formed in a plane 325. By way of example, a diameter of the beam foci 323 can be e.g. 10 nanometers, 100 nanometers and 1 micrometer.

The field lens 307 and the objective lens 102 provide first imaging particle optics for imaging the plane 325, in which the beam foci are formed, onto the first plane 101 such that a field 103 of impingement locations 5 or beam spots is created there. To the extent that a surface of the object 7 is arranged in the first plane, the beam spots are accordingly formed on the object surface.

The objective lens 102 and the projection lens arrangement 205 provide second imaging particle optics for imaging the first plane 101 on the detection plane 211. Therefore, the objective lens 102 is a lens which is part of both the first and the second particle optics, while the field lens 307 only belongs to the first particle optics and the projection lens 205 only belongs to the second particle optics.

A beam switch 400 is arranged in the beam path of the first particle optics between the multi-aperture arrangement 305 and the objective lens system 100. The beam switch 400 is also part of the second particle optics in the beam path between the objective lens system 100 and the detector system 200.

Further information in respect of such multiple beam particle beam systems and components used therein, such as particle sources, multi-aperture plates and lenses can be obtained from the international patent applications WO 2005/024881, WO 2007/028595, WO 2007/028596, WO 2011/124352 and WO 2007/060017 and the German patent applications with the application numbers DE 10 2013 016 113.4 and DE 10 2013 014 976.2, the disclosures of which are included in their entirety in the present application by reference.

Furthermore, the detector system 200 has a filter device 208, with the aid of which the interaction products (e.g. electron beams 9) emerging from the object 7 or the first plane 101 are filtered in accordance with the trajectory thereof. Examples for detector devices with different filter devices are described in more detail below on the basis of FIGS. 2-15.

The multiple beam particle beam system furthermore has a controller 10, which is embodied both for controlling the individual particle-optical components of the multiple beam particle beam system and for evaluating and analyzing the detector signals obtained by the multi-detector 209. Furthermore, the controller 10 is embodied to produce images of object surfaces on a reproduction device, e.g. a display, proceeding from the detector signals generated by the multi-detector 209.

Figure 2:
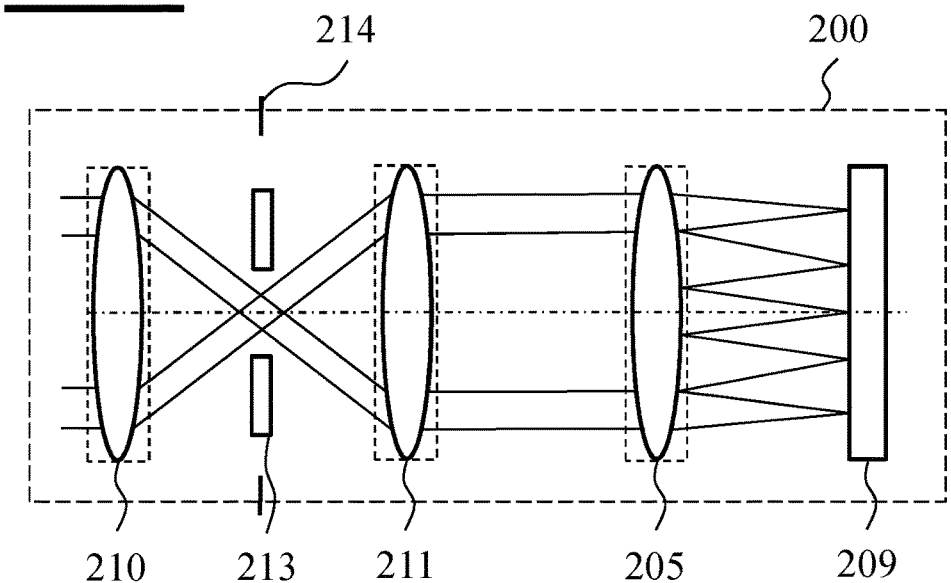
FIG. 2 shows a schematic diagram of a detector system in first embodiment.

The detector system 200 in FIG. 2 has two further particle beam lenses 210, 211 in addition to the projection lens 205 and the multi-detector 209. The first further particle beam lens 210 forms a crossover in a crossover plane 214. In this crossover plane 214, the trajectories of the interaction products which leave the first plane 101 (object plane) in different regions are superposed. The second additional particle beam lens 211 is operated in such a way that the focal plane thereof is substantially in the crossover plane 214 of the first additional particle beam lens 210. The interaction products emerging in the first plane 101 in various regions then propagate separately from one another again behind the second additional particle beam lens 211 and they are projected to the various detection regions 215 of the multi-detector 209 by the projection lens 205.

Figure 3:
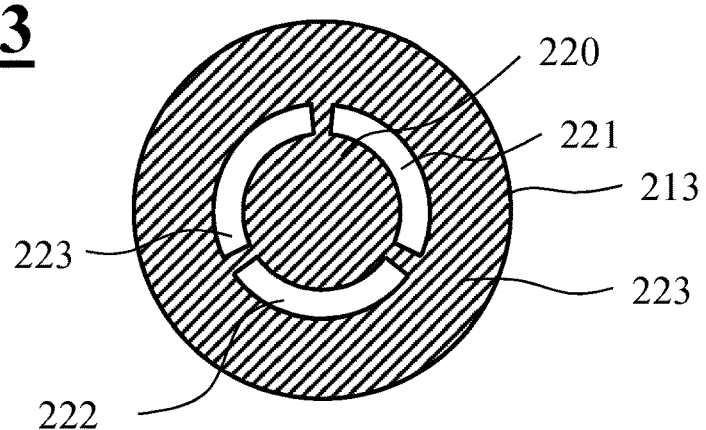
FIG. 3 shows a top view of a stop with a ring-shaped aperture.
Figure 6:
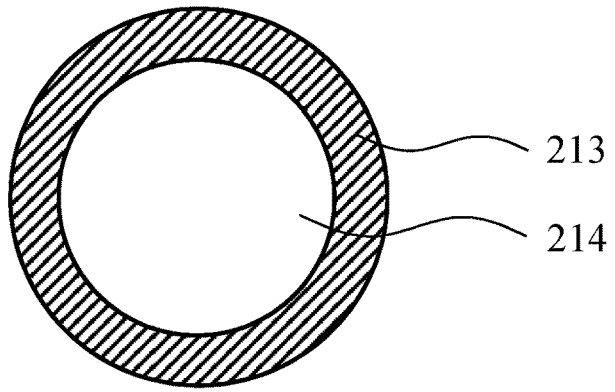
FIG. 6 shows a top view of a stop with a circular aperture.

A stop 213, with the aid of which the interaction products can be filtered as desired in accordance with their respective trajectory, is arranged in the crossover plane 214 or in the vicinity of the crossover plane 214, i.e. between the two additional particle beam lenses 210 and 211. Two exemplary stops 213 are depicted in FIGS. 3 and 6. The stop 213 depicted in FIG. 3 has a central region 220 and a peripheral region 223, which are both non-transmissive to the interaction products. Between the central region 220 and the peripheral region 223, the stop 213 has a ring-shaped region that is transmissive to interaction products, said region consisting of three ring segments 221, 222, 223 in the depicted embodiment. The webs present between the ring-shaped segments 221, 222, 223, which separate the ring-shaped segments from one another, merely serve to connect the central region 220 and the peripheral region 223 to one another. With the aid of such a ring-shaped stop, it is possible to filter the interaction products in accordance with their start angle when emerging from the object 7 or when leaving the first plane 101. Hence, only those interaction products which left the first plane 101 in a specific angular region can pass the stop in one of the three ring segments 221, 222, 223 transparent to the interaction products. With the aid of such a stop it is possible to increase the topography contrast since the interaction products (e.g. secondary electrons) predominantly emerge under a larger angle of inclination relative to the incident partial beams at the edges of the object surface 7.

Since the stop 213 is arranged in a crossover plane 214 of the detector system, only a single ring-shaped stop is used for all partial beams of the multiple particle beam system. In this way, the interaction products produced from the object 7 by all partial beams of the particle beam system experience the same filtering.

In the embodiment in FIG. 2, the two further particle beam lenses 210, 211 form a projective system together with the stop 213 and the projection lens 205.

The stop 213 in FIG. 6 merely has a circular aperture 214 that is transmissive to the interaction products. Crosstalk of the detection signals between the detection regions of the detector 209 can be avoided with the aid of such a "bright field stop" in the crossover plane 214 of the detector system 200 in FIG. 2. Crosstalk between the detection regions 215 can be created when interaction products that emerge from a field region in the first plane 101 impinge on a detection region 215 that is not assigned to this field region. With the aid of the bright field stop 213 in FIG. 6, it is possible to ensure via a suitable selection of the aperture diameter of the circular aperture 214 that all interaction products which, due to their trajectory, would impinge on a detection region not associated with the corresponding field region are filtered out and absorbed by the stop 213. The trajectories of those interaction products which have a combination of large start angles and large start energy when emerging from the object extend in the outer region of the crossover plane in terms of the radial direction. The crosstalk between adjacent beams can be reduced by a bright field stop. Moreover, the contrasts, such as e.g. edge contrasts, can be influenced by a bright field stop.

Figure 12:
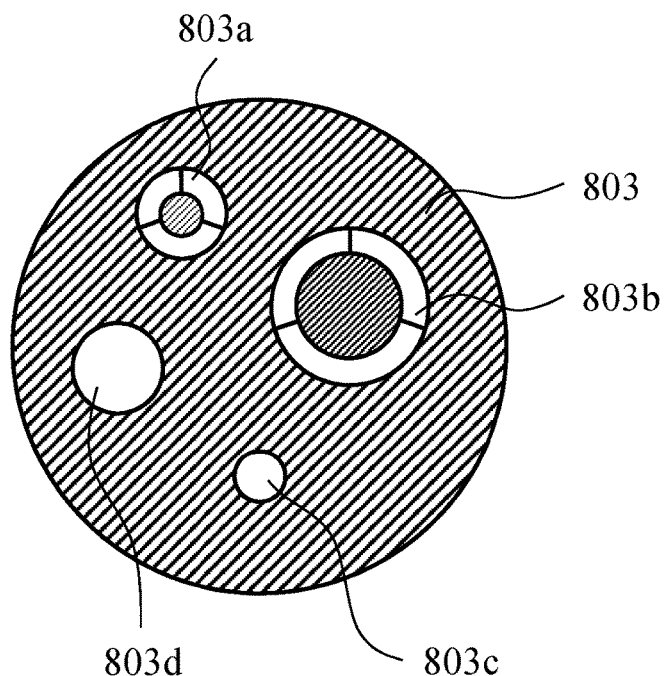
FIG. 12 shows a top view of a multiple stop with a plurality of bright field apertures and dark field apertures.

In order to be able to produce different filtering, the stops 213 can be arranged in an interchangeable manner in the detector system 200 and provision can be made for a plurality of stops with different aperture diameters, ring diameters and ring widths. As an alternative to an interchangeable stop with only one stop aperture, it is also possible to use multiple stops. A top view of a multiple stop 803 with a plurality of stop apertures 803a-803d is depicted in FIG. 12. In the multiple stops depicted in FIG. 12, two stop apertures 803a, 803b each have ring-shaped apertures transparent to interaction products, wherein both the inner diameter and the outer diameter of the ring-shaped apertures are different. Two further stop apertures 803c, 803d are circular and have different aperture diameters. However, other stop arrangements with more, or fewer, different stop apertures are possible.

Figure 13:
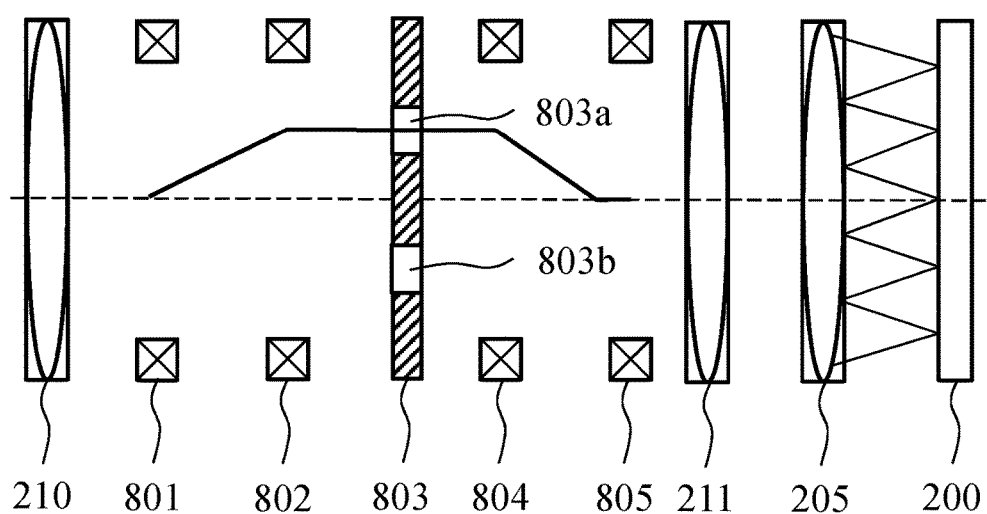
FIG. 13 shows a schematic diagram of a further embodiment of a detector system.

FIG. 13 shows an exemplary embodiment with a detector system, the design of which is similar to the design in FIG. 2. The detector system once again includes a first additional particle beam lens 210, which produces a crossover in a crossover plane. A second additional particle beam lens 211 is once again operated in such a way that the focal plane thereof coincides with the crossover plane formed by the first further particle beam lens 210. The interaction products emerging in various regions in the first plane 101 then propagate separately from one another again behind the second additional particle beam lens 211 and they are projected onto the various detection regions 215 of the multi-detector 209 by the projection lens 205. In addition to the exemplary embodiment in FIG. 2, a first double deflection system 801, 802 is arranged between the first additional particle beam lens 210 and the crossover plane and a second double deflection system 803, 804 is arranged between the crossover plane and the second further particle beam lens in the exemplary embodiment of FIG. 13. A multiple stop 803, as is depicted in an exemplary manner in FIG. 12, is arranged in the crossover plane. With the aid of the two double deflection systems 801, 802, 803, 804, one of the apertures of the multiple stop 803 can be selected in this exemplary embodiment, wherein only two apertures 803*a*, 803*b* of the multiple stop are depicted in FIG. 13. Therefore, depending on the excitation thereof, it is possible, with the aid of the double deflection systems, to switch between different contrasts with the aid of the multiple stop. The two double deflection systems 801, 802, 804, 805 therefore act as aperture selectors.

In the embodiment in FIG. 13, the two further particle beam lenses 210, 211 form a projective system together with the stop 213, the double deflection systems 801, 802, 803, 804 and the projection lens 205.

Figure 4:
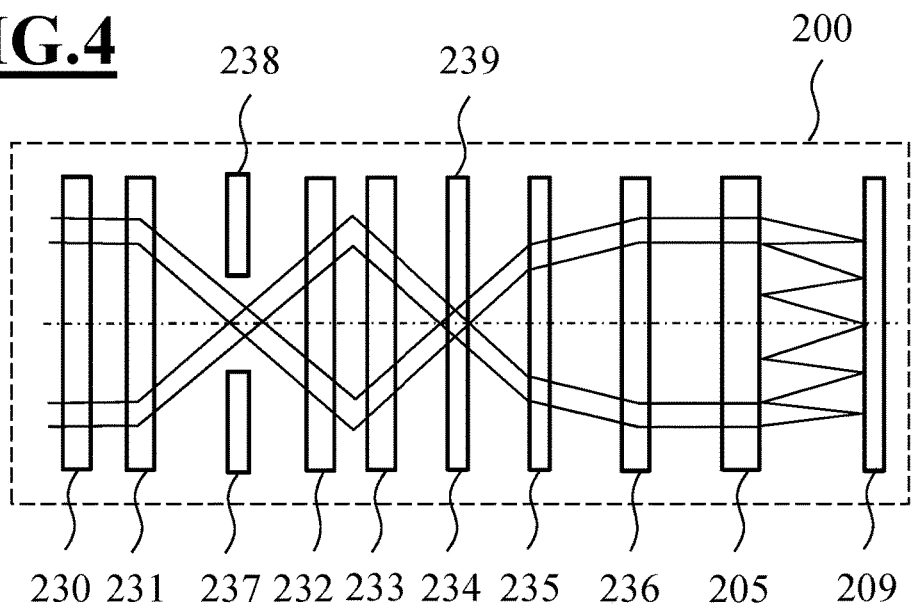
FIG. 4 shows a schematic diagram of a second embodiment of a detector system.

In addition to the projection lens 205 and the multi-detector 209, the detector system 200 in FIG. 4 has six further particle beam lenses 230, 231, 232, 233, 235, 236. The two first further particle beam lenses 230, 231 form a first crossover in a first crossover plane 238, the two subsequent further particle beam lenses 232, 233 form a second crossover in a second crossover plane 239. The two further particle beam lenses 235, 236 following the second crossover plane 239 re-collect the particle beams of the interaction products emerging from the second crossover plane 239 in such a way that the interaction products emerging from the various field regions in the first plane 101 are again projected onto various detection regions 215 of the multi-detector 209 with the aid of the projection lens 205 on the multi-detector 209.

In this embodiment of the detector system 200, two different stops 237, 234 can be used simultaneously in the first and in the second crossover plane 238 and 239. By way of example, the bright field stop 213 depicted in FIG. 6 can be arranged in the first crossover plane 238 and the stop with a ring-shaped aperture depicted in FIG. 3 can be arranged in the second crossover plane 239. The suppression of crosstalk between the detection regions 215 and the targeted filtering of the interaction products according to the start angle thereof in the first plane 101 is carried out simultaneously in this embodiment.

Here, attention is drawn to the fact that the two stops 237, 234 can also be arranged in an interchanged manner such that a stop with a ring-shaped aperture is arranged in the first crossover plane 238 and a stop with a central aperture is arranged in the second crossover plane 239.

By varying the excitations of the further particle beam lenses 230, 231, 232, 233, 234, 235, it is possible to set the trajectories of the interaction products independently of one another in the two crossover planes 238, 239. By varying the trajectories in the crossover planes 238, 239, it is possible to simulate different stop radii and stop diameters, without stops needing to be mechanically interchanged herefor. The trajectories when entering into the detector system 200 and when entering into the projection lens 205 can be kept constant in this case such that the association between the field regions in the first plane 101 and the detection regions of the multi-detector 209 can be maintained. The object field transmitted by all partial beams of interaction products in the first plane 101 remains unchanged and constant in the process.

In this case, the further particle beam lenses 230, 231, 232, 233, 235, 236 can be either magnetic lenses or electrostatic lenses.

In the embodiment of FIG. 4, the six further particle beam lenses 230, 231, 232, 233, 235, 236 form a projective system together with the two stops 234, 237 and the projection lens 205.

Figure 5:
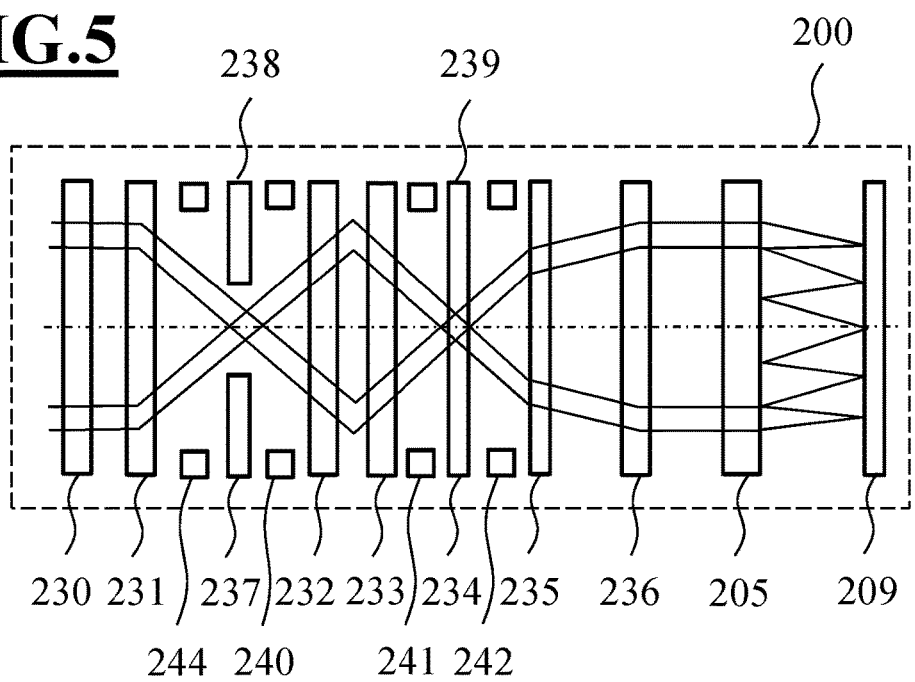
FIG. 5 shows a schematic diagram of a further embodiment of a detector system.

The embodiment of the detector system 200 in FIG. 5 has a very similar design to the detector system 200 in FIG. 4. In particular, the detector system 200 in FIG. 5 once again has a total of six further particle beam lenses 230, 231, 232, 233, 235, 236 in addition to the projection lens 205 and the multi-detector 209, of which further particle beam lenses the first two further particle beam lenses 230, 231 once again produce a first crossover in a first crossover plane 238 and the two subsequent further particle beam lenses 232, 233 once again produce a second crossover in a second crossover plane 239.

In addition to the embodiment in FIG. 4, the detection system 200 in FIG. 5 has respectively one deflection system 240, 244 in front of the first crossover plane 238 and behind the first crossover plane 238 in each case. The detector system 200 likewise has respectively one deflection system 241, 242 in front of and behind the second crossover plane 239. As a result of different excitations of the deflection systems in front of and behind the respective crossover plane 238, 239 with respectively one stop 237, 238 situated therebetween, it is possible to amplify edge effects in the signals detected by the multi-detector 209 and it is possible to produce shadow effects. What is important here is that the deflection which the beams of the interaction products experience by the deflection system 244, 241 respectively arranged in front of the crossover plane is compensated for again by the deflection system 240, 242 arranged behind the respective crossover plane. Since the crossover plane lies between the two deflection systems respectively assigned to one another, this means that the deflection system 244, 241 arranged in front of a crossover plane and the deflection system 240, 242 arranged behind the same crossover plane can produce identical deflections in the case of a specific configuration.

It is possible to generate 3D data records of the sample surface by recording a plurality of images with different deflection angles in the crossover planes and by evaluating the respectively occurring shadow effects in a controller 10.

The deflection systems 240, 244, 241, 242 can respectively be embodied as single deflection systems or as double deflection systems, with single deflection systems being sufficient for most applications.

In the embodiment in FIG. 5, the six further particle beam lenses 230, 231, 232, 233, 235, 236 form a projective system together with the two stops 237, 238, the deflection systems 240, 244, 241, 241 and the projection lens 205.

Figure 7:
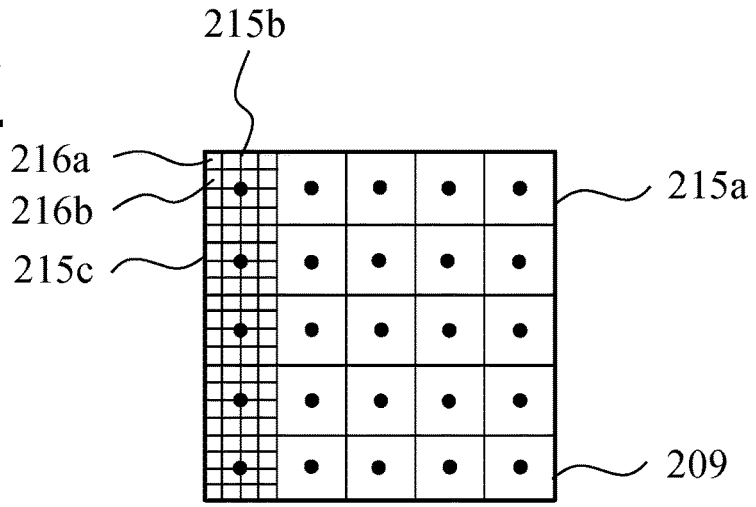
FIG. 7 shows a schematic diagram of an embodiment of a detector system with a detector which has a multiplicity of detection fields for each detection region.

FIG. 7 shows a top view of a multi-detector 209 of a further embodiment of a detection system. This detector 209 also has an associated detection region 215*a*, 215*b*, 215*c* for each field region in the plane 101. However, in this detector 209, each of the detection regions 215*a*, 215*b*, 215*c* is once again subdivided into a multiplicity of detection fields 216*a*, 216*b* which detect independently of one another. In FIG. 7, this subdivision of the detection regions 215*a*, 215*b* into detection fields 216*a*, 216*b* which detect independently of one another is only depicted for one column of the detection regions, with the detection regions 215*b* and 215*c*. Moreover, respectively 20 detection fields 216*a*, 216*b* are depicted in FIG. 7 for each detection region 215*b*, 215*c*. However, the number of detection fields 216*a*, 216*b* per detection region 215*b*, 215*c* can also be a different one; in particular, more, or fewer, detection fields can be present per detection field. The number of detection fields per detection region preferably lies in the range between 3 and 64. Square or hexagonal arrangements of the detection fields, but other symmetries as well, are possible. In cases where a high measurement speed is not that important, it is also possible for the number of detection fields per detection region to be significantly larger.

In this embodiment of the detector system 200, the interaction products are filtered in accordance with their respective trajectory only when the corresponding interaction products impinge on the multi-detector 209 by virtue of the output signals of the detection fields 216*a*, 216*b* belonging to the same detection region 215*b*, 215*c* remaining unconsidered for the image production in the subsequent evaluation by the controller 10, or by virtue of the output signals of the various detection fields, which belong to the same detection region, being combined with one another in a suitable manner by calculation via the controller 10.

A corresponding multi-detector 209 with a multiplicity of detection fields 216*a*, 216*b* per detection region 215*a*, 215*b*, 215*c* can be implemented in many different ways. A first embodiment for such a multi-detector 209 can be a CCD camera with an upstream scintillator. Each pixel of the CCD camera then forms a detection field 216*a*, 216*b* and a plurality of detection fields together then form respectively one detection region 215*a*, 515*b*, 215*c*. In another embodiment, a fiber cable, which transports the light produced in the scintillator by the interaction products impinging thereon to the detectors, can be arranged between a scintillator and a detector. The fiber cable then has at least one fiber for each detection field 216*a*, 216*b*. And the detector likewise has a dedicated detector or a dedicated detector pixel for each detection field. However, alternatively, a corresponding detector 209 can also be a very fast pixelated electron detector, which directly converts incident electrons (interaction products, secondary electrons) into an electrical signal. In this case, each detector pixel also forms a detection field. Combinations of the described embodiments are also possible. By way of example, fiber cables arranged behind a scintillator can lead to a first group of detectors, which have only a single detector for each detection region. Using a beam splitter arranged between the scintillator and the entry ends of the fiber cable, another part of the light produced in the scintillator can be guided to a second group of detectors which has a plurality of detectors for each detection region. Each detector associated with the same detection region then forms a detection field. Since the two groups of detectors have a very different number of detectors, the two groups of detectors can then be read with correspondingly different clocks for the whole detector group. Since the second group of detectors generally has a lower clock due to the greater number of detectors, it is possible to obtain signals therewith which do not require high data rates, such as e.g. signals for components for the beam adjustment, while signals which are used for the image production are obtained with the first group of detectors.

Figure 8:
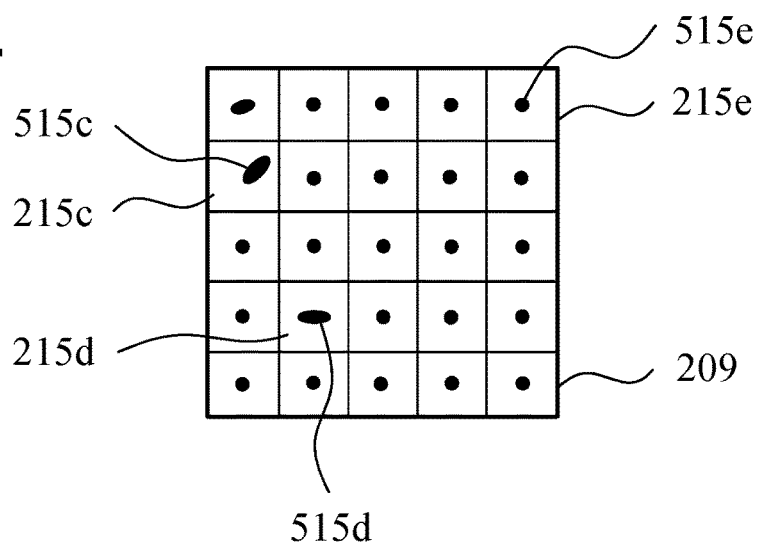
FIG. 8 shows a top view of a detector with a multiplicity of detection regions with intensity distributions, indicated thereon in exemplary fashion, of the interaction products incident on the detection regions.
Figure 9:
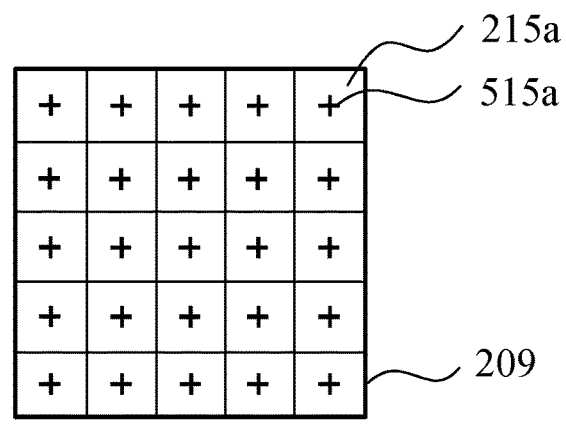
FIG. 9 shows a top view of a detector with a multiplicity of detection regions with intensity distributions, indicated thereon in exemplary fashion, of the interaction products incident on the detection regions.

FIGS. 8 and 9 respectively depict further top views of corresponding multi-detectors 209, with the intensity distributions of the respective particle beam of the interaction products incident on the respective detection region being simultaneously indicated within the detection regions.

If the objective 102, the beam switch 400 and the projection lens 205 were to be absolutely aberration free, and if the object surface were plane and without charge, the interaction products emerging from each field region in the plane 101 would be projected onto the detector 209 by the system made of objective, beam switch 400 and projection lens 205 in such a way that the intensity distribution in each detection region 215 is rotationally symmetric, as is indicated for the intensity distribution 515*e* in a detection region 215*e* in FIG. 8. However, due to various effects, the actual intensity distributions incident on the respective detection region deviate from this ideal case. By way of example, such effects can be topography effects of the object surface, which influence the start conditions of the secondary electrons emerging from the object, or else sample charge effects. Moreover, intensity distributions which deviate from the rotational symmetry may occur in the detection regions due to aberrations in the objective 102, the beam switch 400 and the projection lens 205. This is indicated in FIG. 9 by the cross 515*a* in the detection region 215*a*. If the deviation from the rotational symmetry caused by the aberrations is known in the case of ideal focusing, this information can be used to produce an autofocus signal. To this end, the interaction products detected in the individual detection fields of the same detection region and the detector signals emerging therefrom can be analyzed in respect of the spatial distribution thereof. If the established symmetry of the intensity distribution deviates from the known intended geometry, an adjustment, e.g. refocusing, is involved. Ideal focusing is achieved when the symmetry of the intensity distribution in a detection region has the intended symmetry. A global displacement or deformation of the intensity distributions of the interaction products at the detector relative to the intended positions or intended distributions allows conclusions to be drawn about the global sample geometry, such as e.g. a sample tilt, or a global sample charge. Here, a sample property is global if it extends over more than one field region of an individual beam.

If a primary partial beam impinges on an edge of the object surface in the first plane 101, this generally causes both a displacement of the intensity distribution in the plane of the multi-detector 209 and a change in the form of the intensity distribution due to different trajectories of the interaction products emerging from the sample. This is indicated in FIG. 8 for the intensity distributions 515*c* and 515*d* in the portions 215*c* and 215*d*. The changed form of the intensity distribution of the interaction products in the plane of the multi-detector 209 results from a corresponding change in the trajectories of the interaction products due to the surface topography or due to other effects, such as e.g. local charging, of the object. By evaluating the detection signals recorded with the individual detection fields, it is once again possible to determine both the displacement of the intensity distribution of the detected interaction products and the deviation of the intensity distribution from the rotational symmetry. By evaluating this additional information, the image information subsequently presented to the user can be improved, for example by virtue of edges being highlighted.

In the reflection mode in particular, it is possible to deduce the local start angle of secondary electrons by determining the positions thereof on the detector. It is advantageous to let this evaluation be carried out more than once per image (frame) and it is particularly advantageous to carry this out per scanning pixel. The lateral form of the features can be calculated from the start angle distribution together with further information about the object, such as material composition and/or height of the topological features. To this end, the relative positions of the brightness distributions, as are produced by the secondary electrons, can be analyzed and the local, relative beam form changes and beam position changes at the detector can be analyzed.

Figure 14:
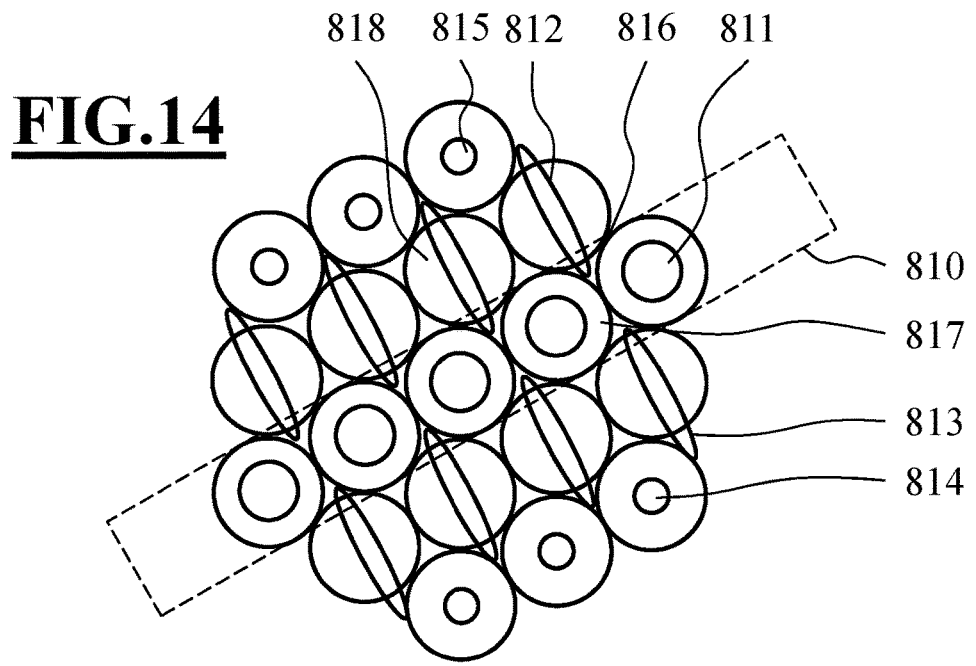
FIG. 14 shows a further top view of a detector with a multiplicity of detection regions with intensity distributions, indicated thereon in exemplary fashion, of the interaction products incident on the detection regions in the case of object charges.

Charging of the object at the impingement location of a primary particle beam also leads to a displacement of the intensity distribution of the interaction products in the detector plane and to a change in the form of the intensity distribution of the interaction products. As depicted in FIG. 14, charging of the object in a charging region 810 can lead to the interaction products in one part of the detection regions 811 having broader intensity distributions. In other detection regions 812, 813, 818, the intensity distributions are displaced in relation to the case of a non-charged object and, in part, also elongated such that elliptic intensity distributions emerge in the plane of the multi-detector 209. In other detection regions 814, 815, the associated locations of which on the object surface are far enough away from the charging region, the charging of the object no longer has an effect and the intensity distributions have their predetermined form and position. There can easily be crosstalk of the detected signals, particularly in the detection regions 817, into which the intensity distribution of an adjacent detection region 812 projects.

Figure 15:
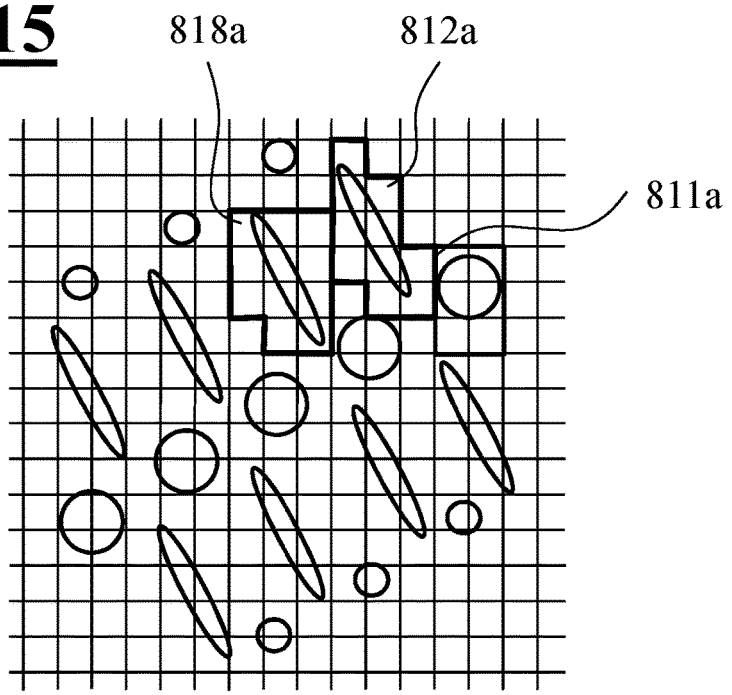
FIG. 15 shows a further top view of the detector from FIG. 14 with a modified assignment between detection fields and detection regions.

Charge contrast images can be produced in a targeted manner by evaluating the detector signals in the individual detection fields. By way of example, this can be brought about by virtue of those points, at which a specific form of the intensity distribution of the interaction products is detected, being depicted in a special way in the depicted image. Furthermore, crosstalk can be prevented by virtue of the association between the detection regions and the assigned detection fields being modified on the basis of the intensity distributions determined with the aid of the detection fields. This is depicted in FIG. 15 for three detection regions 811a, 812a, 818a. The detection fields, which are respectively indicated as a square in FIG. 15, are determined proceeding from the respective locally determined intensity distribution in the individual detection regions, and combined anew to form detection regions 811a, 812a, 818a, in such a way that the respective intensity distribution of the interaction products lies completely within the boundaries of each detection region. By way of example after the reassignment, six detection fields are associated to the original detection region 811 in FIG. 14, while a detection region 812a with ten detection fields emerges after the reassignment from a different original detection region 812. After the reassignment of the detection fields to the detection regions, the detector signals in all detection fields are then respectively added to a signal and associated with the corresponding object point on the object surface as an image signal. Optionally, the reassignment of the detection fields to the detection regions can be implemented during the evaluation of the detector signals for individual image points on the object surface.

As described above charging or an excessive edge contrast can lead to crosstalk (crosstalk between the detector channels) in a multi-detector with a single fixed detection region for each image region since the detected signals, in part, can no longer be uniquely associated with the detector regions. Using a detector which has a plurality of detection fields per detection region, that is to say in which a plurality of detectors are available for each primary beam, it is possible to re-associate the detection fields associated with each detection region in such a way, depending on the position of the beams after analysis of the beam positions by finding simple contiguous regions with increased signal strength, that, firstly, the crosstalk is reduced and, secondly, no detector signal is lost in other channels. It is particularly advantageous if this evaluation is implemented not only once per frame, but a number of times per frame or even per pixel. As a result, the constraints for a possible charge compensation system or topography constraints of the object are substantially reduced.

Particularly in the case of charging objects, it is possible by virtue of this method in the reflection mode to deduce the local object structure, as described above.

By integrating all detector signals of all detection fields which belong to the same detection region 215a, it is then also possible to obtain image information if the irradiation of the object with primary beams leads to a local sample charging.

Figure 10:
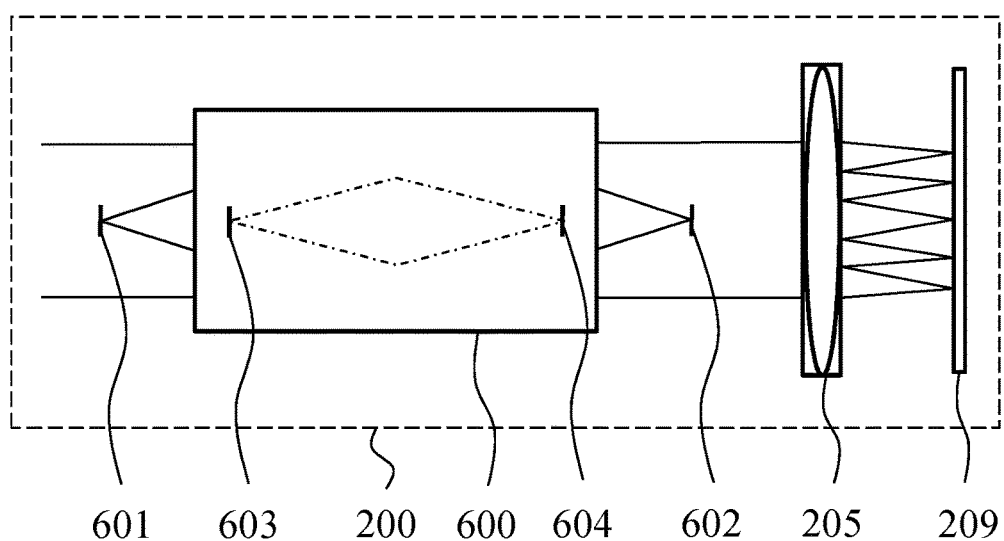
FIG. 10 shows a schematic diagram of a detector system with an energy filter.

The detection system 200 in FIG. 10 has a so-called imaging energy filter 600, for example an Omega filter, in addition to the multi-detector 209 and the projection lens 205. By way of example, such an imaging energy filter is described in U.S. Pat. No. 4,740,704 A. The imaging energy filter 600 images a first input-side plane 601 into an output image plane 602 in an achromatic fashion. At the same time, the imaging energy filter images a second input-side plane 603 into a second output-side plane 604, the dispersion plane, in a dispersive fashion. By arranging a stop in the dispersion plane 604, in which the second input-side plane 603 is imaged, it is possible to vary the energy of those interaction products that are able to pass the filter 600. What can be achieved in this manner is that only those interaction products which emerge from the object with an energy predetermined by the stop in the dispersion plane 604 are detected by the multi-detector 209. In this embodiment, the filtering of the interaction products is also implemented in accordance with their respective trajectory in the projective system, even if the energy filter ensures that the trajectory of each interaction product depends on the kinetic energy thereof in the filter. In this embodiment, the imaging energy filter 600 forms the projective system together with the projection lens 205.

In the manner described above, it is possible to produce voltage contrast images with the multiple beam system since the energy of the interaction products is determined by the electric potential of the object at the location at which the interaction products leave the object.

Figure 11:
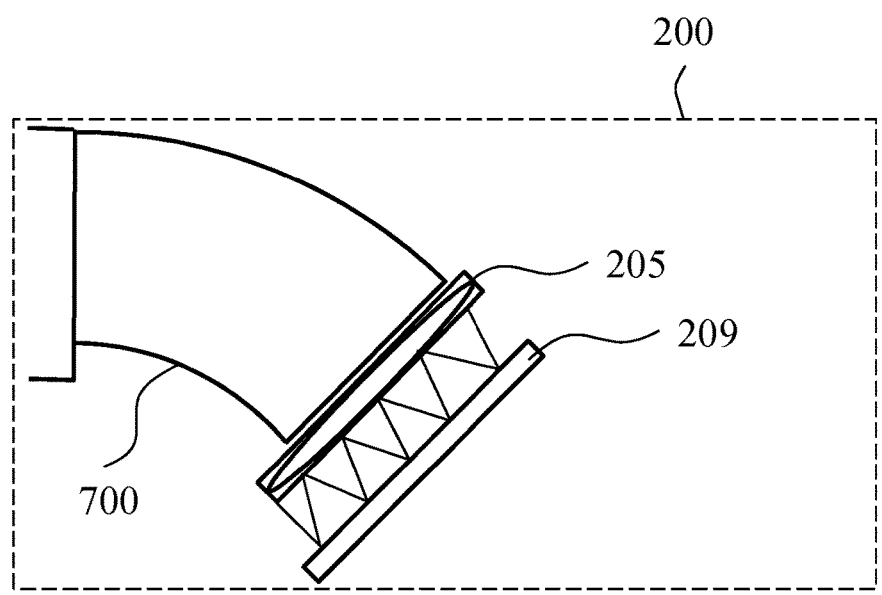
FIG. 11 shows a schematic diagram of a detector system with a dispersive element.

FIG. 11 depicts a detector system 200, which has a dispersion-producing element 700 in addition to the multi-detector 209 and the projection lens 205. By way of example, such a dispersion-producing element can be a magnetic sector. Interaction products entering the dispersion-producing element 700 are split in the dispersion-producing element 700 in accordance with the kinetic energy thereof. In this case, the multi-detector 209, like the detector in FIG. 7, has a multiplicity of detection fields 216a, 216b for each detection region. The interaction products emerging from each field region in the plane 101 then impinge on different detection fields 216a, 216b of the same detection region 215b due to the dispersion in the dispersion-producing element 700. As a result of a suitable evaluation of the detector signals in the various detection fields, it is once again possible to obtain image information which depends on the kinetic energy of the interaction products which are detected in the respective detection field. Since the kinetic energy of the interaction products in turn depends on the electrostatic potential at the location at which the interaction products left the first plane 101, it is possible to produce voltage contrast images in this manner.

By evaluating the distribution of the signals in the detection fields belonging to the same detection region, it is possible to draw conclusions about the adjustment state of the overall system. These conclusions or this information can be used to readjust the system in an automated manner or to activate automated adjustment actions. An evaluation of the form of the distribution or an offset of the signals in the detection fields belonging to the same detection region can also be used to draw conclusions about the focusing and other parameters, such as the inclination of the object surface. Additionally or alternatively, the distribution of the signals in the detection fields belonging to the same detection region can be averaged over a plurality of detection fields and/or over time. This then supplies information about global object properties, such as the global inclination of the object surface relative to the optical axis of the particle beam system.

Figure 16:
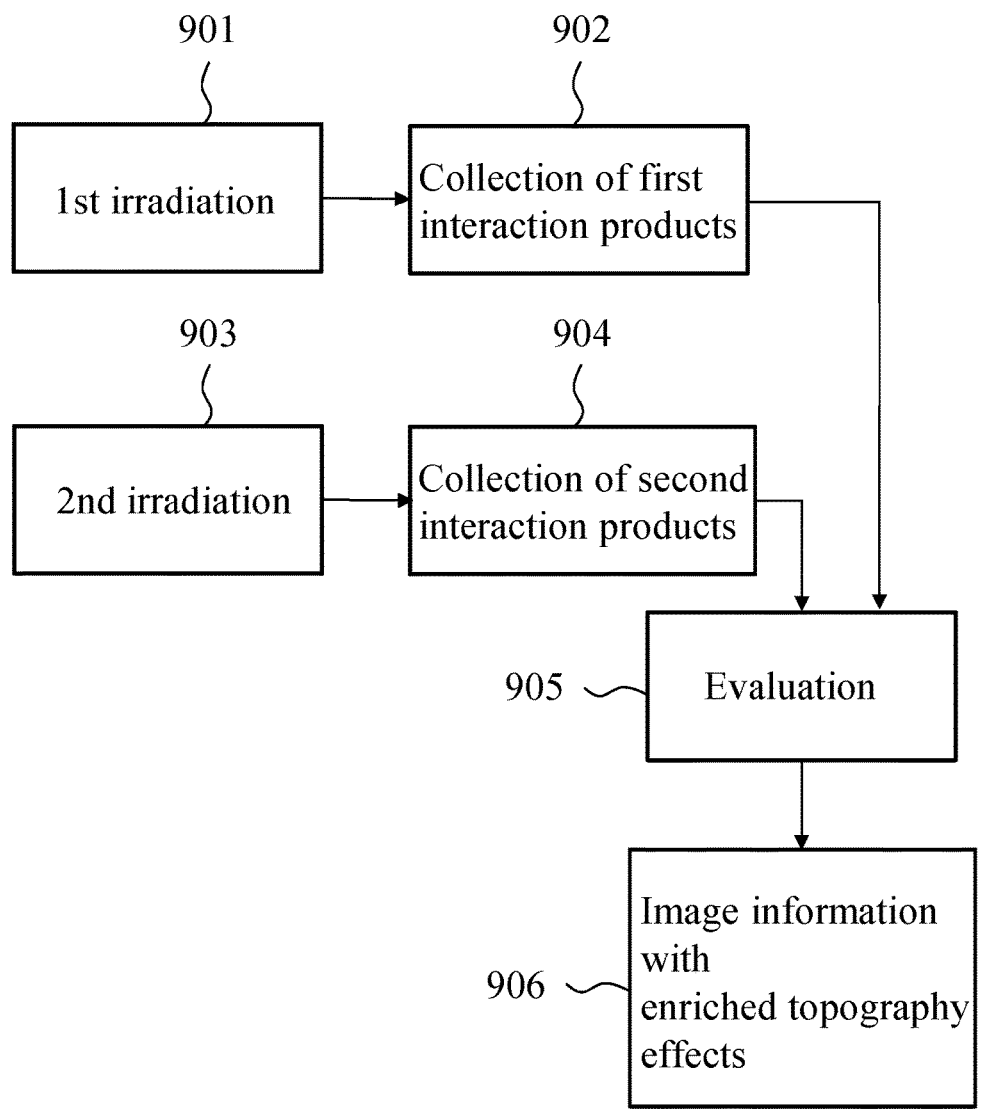
FIG. 16 shows a flowchart for a method for amplifying topography effects.

FIG. 16 describes a method which can be carried out using a particle beam instrument and by which image information with amplified topography effects of the object surface can be obtained. In a first step, the object surface is simultaneously irradiated in a plurality of mutually separated field regions with a primary beam of charged particles in each case. Here, in a step 902, interaction products, which emerge from the object due to the incident primary beams, are collected with the aid of a first suction field and the interaction products collected with the first suction field are projected onto a plurality of detection regions of a detector in such a way that the interaction products emerging from two different field regions are projected onto different detection regions of the detector. Thereafter, the object surface is once again irradiated simultaneously in a further step 903 in the plurality of mutually separated field regions, respectively with a primary beam of charged particles. Here, in a step 904, interaction products which emerge from the object due to the incident primary beams are collected with the aid of a second suction field, wherein the second suction field differs from the first suction field. Here, the interaction products collected with the second suction field are in turn projected onto the plurality of detection regions of the detector in such a way that the interaction products emerging from the object from two different field regions are projected onto different detection regions of the detector. In a subsequent step 905, the signals detected in the case of the two different suction fields are evaluated together and, in a step 906, a data signal is obtained from the detector signals obtained in the case of the different suction fields, in which data signal topography effects of the object are highlighted. The two suction fields in steps 901 and 903 should differ significantly from one another in this case; in particular, the electric field strength of the stronger suction field should be at least 10%, even better more than 20%, greater than the electric field strength of the weaker suction field at the surface of the object. At the same time, the electric field strength of the stronger suction field should be at least 100 V/mm greater than the electric field strength of the weaker suction field.

What is claimed is:

1. A particle beam system, comprising:
   a particle source, configured to produce a first beam of charged particles;
   a multiple beam producer configured to produce a plurality of partial beams from a first incident beam of charged particles, which partial beams are spaced apart spatially in a direction perpendicular to a propagation direction of the partial beams, the plurality of partial beams comprising first and second partial beams;
   an objective configured to focus incident partial beams in a first plane so that a first region, on which the first partial beam is incident in the first plane, is separated from a second region, on which a second partial beam is incident;
   a detector system, comprising:
     a projective system;
     a plurality of detection regions; and
     a filter device
   wherein:
     the projective system is configured to project interaction products, which leave the first plane due to the incident partial beams, onto the plurality of detection regions;
     the projective system comprises first and second additional charged particle beam lenses;
     a crossover plane is between the first additional charged particle beam lens and the second additional charged particle beam lens;
     the projective system and the plurality of detection regions are matched to one another so that interaction products emanating from the first region of the first plane are projected onto a first detection region of the detector system and interaction products emanating from the second region of the first plane are projected onto a second detection region different from the first detection region;
     the filter device is configured to filter the interaction products in accordance with their respective trajectory and comprises a stop arranged in a vicinity of the crossover plane;
     the stop comprises a multiple stop which comprises a plurality of stop apertures;
     the plurality of stop apertures comprises first and second stop apertures;
     the first stop aperture has a circular opening; and
     the second stop aperture has a ring shaped aperture.

2. The particle beam system as claimed in claim 1, wherein the projective system defines first and second crossover planes, the multiple stop is arranged in a first one of the first and the second crossover planes, and the filter device comprises a further stop arranged in a second one of the first and second crossover planes.

3. The particle beam system as claimed in claim 1, wherein the multiple stop comprises at least two ring shaped apertures having different ring diameters and ring widths.

4. The particle beam system as claimed in claim 3, wherein the multiple stop comprises at least two circular stops having different aperture diameters.

5. The particle beam system as claimed in claim 1, further comprising:
   a first double deflection system arranged between the first additional charged particle beam lens and the crossover plane; and
   a second double deflection system arranged between the crossover plane and the second additional charged particle beam lens.

6. The particle beam system as claimed in claim 1, wherein the first additional charged particle beam lens comprises a system which comprises two lenses, and the second additional charged particle beam lens comprises a system which comprises two lenses.

7. The particle beam system as claimed in claim 6, further comprising:
a first deflection system arranged between the first additional charged particle beam lens and the crossover plane; and
a second deflection system arranged between the crossover plane and the second additional charged particle beam lens.

8. A particle beam system, comprising:
a particle source configured to produce a first beam of charged particles;
a multiple beam producer configured to produce a plurality of partial beams from a first incident beam of charged particles, which partial beams are spaced apart spatially in a direction perpendicular to a propagation direction of the partial beams, wherein the plurality of partial beams comprises first and second partial beams;
an objective configured to focus incident partial beams in a first plane in such a way that a first region, on which the first partial beam is incident in the first plane, is separated from a second region, on which a second partial beam is incident; and
a detector system, comprising:
a projective system;
a plurality of detection regions; and
a filter device,
wherein:
the projective system is configured to project interaction products, which leave the first plane due to the incident partial beams, onto the plurality of detection regions;
the projective system comprises first, second and third additional charged particle beam lenses;
a second crossover plane is between the second additional charged particle beam lens and the third additional charged particle beam lens;
the projective system and the plurality of detection regions are matched to one another so that interaction products emanating from the first region of the first plane are projected onto a first detection region of the detector system and interaction products emanating from the second region of the first plane are projected onto a second detection region different from the first detection region;
the filter device is configured to filter the interaction products in accordance with their respective trajectory;
the filter device comprises a first stop arranged in a vicinity of the first crossover plane;
the filter device comprises a second stop arranged in a vicinity of the second crossover plane; and
a stop selected from the group consisting of the first and second stop has a circular aperture; and
a stop selected from the group consisting of the first and second stop has a ring shaped aperture.

9. The particle beam system as claimed in claim 8, wherein a stop selected from the group consisting of the first and second stop is a multiple stop comprising at least two ring shaped apertures having different ring diameters and ring widths.

10. The particle beam system as claimed in claim 8, wherein a stop selected from the group consisting of the first and second stop is a multiple stop comprising at least two circular stops having different aperture diameters.

11. The particle beam system as claimed in claim 8, wherein a stop selected from the group consisting of the first and second stop is a multiple stop comprising at least two ring shaped apertures having different ring diameters and ring widths and at least two circular stops having different aperture diameters.

12. The particle beam system as claimed in claim 8, further comprising:
a first double deflection system arranged between the first additional charged particle beam lens and the first crossover plane; and
a second double deflection system arranged between the first crossover plane and the second additional charged particle beam lens.

13. The particle beam system as claimed in claim 8, wherein the first additional charged particle beam lens is a system comprising two lenses, and the second additional charged particle beam lens is a system comprising two lenses.

14. The particle beam system as claimed in claim 13, further comprising:
a first deflection system arranged between the first additional charged particle beam lens and the crossover plane; and
a second deflection system arranged between the crossover plane and the second additional charged particle beam lens.

15. A particle beam system, comprising:
a particle source configured to produce a first beam of charged particles;
a multiple beam producer configured to produce a plurality of partial beams from a first incident beam of charged particles, which partial beams are spaced apart spatially in a direction perpendicular to a propagation direction of the partial beams, the plurality of partial beams comprising at least a first partial beam and a second partial beam;
an objective configured to focus incident partial beams in a first plane so that a first region, on which the first partial beam is incident in the first plane, is separated from a second region, on which the second partial beam is incident; and
a detector system, comprising:
a projective system; and
a plurality of detection regions,
wherein:
the projective system is configured to project interaction products, which leave the first plane due to the incident partial beams, onto the plurality of detection regions;
the projective system and the plurality of detection regions are matched to one another in such a way that interaction products emanating from the first region of the first plane are projected onto a first detection region of the detector system and interaction products emanating from the second region of the first plane are projected onto a second detection region different from the first detection region;
the plurality of detection regions are configured so that a plurality of first detection fields are associated with the first detection region and a plurality of second detection fields are associated with the second detection region;
for each first detection field, the first detection field is configured to detect the interaction products incident on the respective first detection field in a manner independent of interaction products incident on other detection fields;

for each second detection field, the second detection field is configured to detect the interaction products incident on the respective second detection field in a manner independent of interaction products incident on other detection fields;

the particle beam system further comprises a controller embodied to separately readout and process detector signals from the plurality of first and second detection fields of an associated detection region;

the controller is configured to analyze detector signals from the plurality of detection fields of an associated detection region; and the controller being configured to reassign detection fields to detection regions based on the results of the analyzing of the detector signals.

16. A method, comprising:

simultaneously irradiating an object in a plurality of mutually separated field regions with respectively one primary beam of charged particles;

collecting interaction products emerging from the object due to the incident primary beams;

projecting the interaction products onto a plurality of detection regions of a detector in such a way that the interaction products emerging from two different field regions are projected onto different detection regions of the detector;

detecting the interaction products in a manner dependent on their respective trajectory, wherein the interaction products are detected via a detector which comprises a plurality of mutually independent detection fields sensitive to interaction products for each detection region, the detecting providing a recorded detection signal for each detection field; and evaluating an intensity distribution of the detected interaction products based on detection signals recorded with the detection fields, wherein the method further comprises at least one of the following:

determining a deviation of the intensity distribution of the detected interaction products from a rotational symmetry; and reassigning detection fields to detection regions based on the results of the analyzing of the detection signals.

17. The method of claim 16, further comprising determining a displacement of the intensity distribution of the detected interaction products.

18. The method of claim 16, further comprising determining a deviation of the intensity distribution of the detected interaction products from a rotational symmetry.

19. The method of claim 17, further comprising determining a deviation of the intensity distribution of the detected interaction products from a rotational symmetry.

20. The method of claim 19, further comprising generating and presenting an image based on the detected interaction products; and highlighting edges in the presented image based on the determined displacement and/or deviation of the intensity distribution of the detected interaction products from a rotational symmetry.

21. The method of claim 16, further comprising reassigning detection fields to detection regions based on the results of the analyzing of the detection signals.

22. The method of claim 21, further comprising after reassigning detection fields to detection regions, adding detection signals recorded for detection fields assigned to a same detection region, and presenting an image based on the added detection signals.

* * * * *

UNITED STATES PATENT AND TRADEMARK OFFICE
CERTIFICATE OF CORRECTION

| | |
|---|---|
| PATENT NO. | : 10,163,603 B2 |
| APPLICATION NO. | : 15/654014 |
| DATED | : December 25, 2018 |
| INVENTOR(S) | : Dirk Zeidler and Stefan Schubert |

It is certified that error appears in the above-identified patent and that said Letters Patent is hereby corrected as shown below:

On the Title Page

Column 1, Related U.S. Application Data, Line 1, delete "Provisional application No." and insert -- Continuation of application No. --.

In the Specification

Column 8, Line 22, delete "12" and insert -- I2 --.

Column 8, Line 38, delete "13" and insert -- I3 --.

Column 13, Line 37, delete "515*b*," and insert -- 215*b*, --.

Signed and Sealed this
Seventh Day of May, 2019

Andrei Iancu
*Director of the United States Patent and Trademark Office*